(12) United States Patent
Wang et al.

(10) Patent No.: US 7,947,991 B2
(45) Date of Patent: May 24, 2011

(54) HIGH EFFICIENCY LIGHTING DEVICE

(75) Inventors: Wei-Kai Wang, Shengang Shiang (TW); Su-Hui Lin, Taichung (TW); Wen-Chung Shih, Taiping (TW)

(73) Assignee: Huga Optotech Inc., Taichung (TW)

( * ) Notice: Subject to any disclaimer, the term of this patent is extended or adjusted under 35 U.S.C. 154(b) by 230 days.

(21) Appl. No.: 12/181,916

(22) Filed: Jul. 29, 2008

(65) Prior Publication Data

US 2010/0025704 A1 Feb. 4, 2010

(51) Int. Cl.
*H01L 27/15* (2006.01)
(52) U.S. Cl. ..... 257/79; 257/98; 257/103; 257/E33.063; 257/E33.069; 257/E51.021
(58) Field of Classification Search ..... 257/79, 257/98, 103, E33.063, E33.069, E51.021
See application file for complete search history.

(56) References Cited

U.S. PATENT DOCUMENTS

| | | | |
|---|---|---|---|
| 5,258,990 A * | 11/1993 | Olbright et al. | 372/50.124 |
| 7,622,746 B1 * | 11/2009 | Lester et al. | 257/98 |
| 2006/0198404 A1 * | 9/2006 | Henrichs | 372/29.02 |
| 2008/0116471 A1 * | 5/2008 | Watanabe | 257/98 |
| 2008/0179605 A1 * | 7/2008 | Takase et al. | 257/94 |

* cited by examiner

*Primary Examiner* — Long K Tran
(74) *Attorney, Agent, or Firm* — Snell & Wilmer L.L.P.

(57) ABSTRACT

A high efficiency lighting device comprising a light emitting diode structure, an eutectic layer and a distributed-Bragg reflecting layer (DBR) therebetween is disclosed. The distributed-Bragg reflecting layer is attached to said light emitting diode structure by vapor deposition and comprises a plurality of high refraction layers, a plurality of low refraction layers and a micro-contact layer array. The high refraction layers and said low refraction layers are arranged in an alternating manner, so as to form a stacked thin film having an alternate high/low refraction pattern. The micro-contact layers are in said stacked thin film and extend vertically through the stacked thin film, therefore connecting said light emitting diode structure and said eutectic layer.

5 Claims, 4 Drawing Sheets

HIGH EFFICIENCY LIGHTING DEVICE

FIELD OF THE INVENTION

The present invention relates to a method of forming a high efficiency lighting device and a structure thereof, and more particularly, to a high efficiency lighting device having a distributed-Bragg reflecting layer (DBR) for increasing the extraction efficiency thereof.

BACKGROUND OF THE INVENTION

With the advancement of epitaxy technology and reduction of manufacture costs, use of light emitting diodes (LEDs) has been gradually introduced to various fields. For example, LEDs have seen use in electronic devices such as mobile phones, multimedia players, PDAs, etc. It is expected that such use will be expended to the general lighting system to replace many conventional lighting devices.

In popularizing the use of light emitting diodes, one important issue, among others, is to increase the lighting efficiency of LEDs to a highest achievable level. Given that, reducing absorbance and attenuation of light generated by LEDs would be a critical area for improvement.

In a conventional LED structure, a metal reflecting mirror is used to reduce light attenuation and increase lighting efficiency. For example, in manufacture process where silver paste binding technology is replaced by eutectic, because the gold/tin thin film used tends to absorb light, hence reducing lighting efficiency, a metal reflecting mirror is used at the back side of a LED to lessen the extent of light absorbance. Referring to FIG. 1, a lighting device 100 of conventional technology is shown. The lighting device 100 has a light emitting diode structure 110, a titanium (Ti) layer 120, an aluminum (Al) layer 130 and a gold/tin (Au/Sn) alloy layer 140. In the conventional lighting device 100, the titanium layer 120 of thickness around 10 Å (angstroms) and the aluminum layer 130 of thickness around 2000 Å are used as a metal reflecting layer, whereas the gold/tin alloy layer 140 is used for eutectic binding process, or eutectic welding. However, in structures that employ conventional metal reflecting layers, such as the titanium layer 120 and the aluminum layer 130 shown in FIG. 1, the reflectivity rendered is not satisfactory, and particularly, the low reflectivity at the Ultra-Violet (UV) band undermines their applicability. Furthermore, the metal reflective thin film affects the reflectivity due to different vapor deposition conditions, resulting in difficulty in assuring the device quality.

Therefore, it is desirable to have a high efficiency lighting device with increased lighting and heat dissipating efficiency of the composing elements thereof.

SUMMARY OF THE INVENTION

According to an aspect of the present invention, there is provided a high efficiency lighting device, which utilizes a distributed-Bragg reflecting layer to improve problems caused by undesirable light absorbance and poor reflectivity of the metal reflecting layer thin film in the conventional technology.

According to another aspect of the present invention, there is provided a high efficiency lighting device, of which the reflectivity is not affected by vapor deposition conditions and which increases the light extraction efficiency.

According to yet another aspect of the present invention, there is provided a high efficiency lighting device, in which the distributed-Bragg reflector layer has a micro-contact layer array to increase the heat dissipating efficiency of the lighting device.

In one embodiment of the present invention, a method of fabricating a high efficiency lighting device includes the following steps: providing a light emitting diode structure; attaching a distributed-Bragg reflecting layer (DBR) to the light emitting diode structure by vapor deposition; and connecting the light emitting diode structure to an eutectic layer through the distributed-Bragg reflecting layer to form the high efficiency lighting device. Furthermore, the step of forming the distributed-Bragg reflecting layer may further comprise forming multiple high refraction layers and low refraction layers in an alternating manner, so as to form a stacked thin film having an alternate high/low refraction pattern, or still more, forming a micro-contact layer array in the stacked thin film, to increase the heat dissipating efficiency of materials used.

The following materials, but not limited to those, may be selectively used in the lighting device of the present invention: titanium dioxide for the high refraction layers, silicon dioxide layers for the low refraction layers, a metal material for the micro-contact layer, and gold/tin alloy for the eutectic layer.

In another embodiment of the present invention, a high efficiency lighting device includes the following components: a light emitting diode structure; an eutectic layer; and a distributed-Bragg reflecting layer between the light emitting diode structure and the eutectic layer, the distributed Bragg reflecting layer being attached to the light emitting diode structure by vapor deposition. The distributed-Bragg reflecting layer may further include multiple high refraction layers and multiple low refraction layers, wherein said high refraction and said low refraction layers are arranged in an alternating manner, so as to form a stacked thin film having an alternate high/low refraction pattern. Moreover, the distributed-Bragg reflecting layer may further include a micro-contact layer array in the stacked thin film.

DETAILED DESCRIPTION OF THE INVENTION

Figure 1:
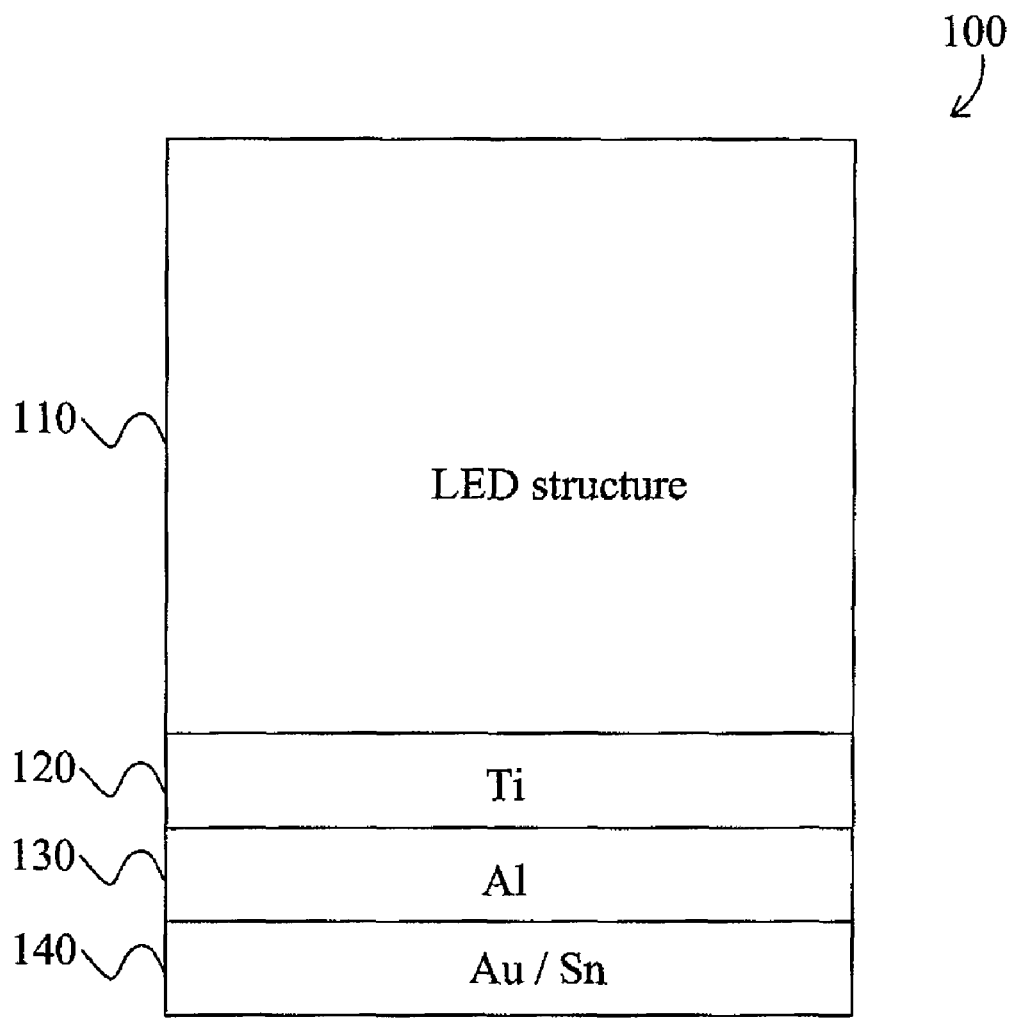
FIG. 1. shows a lighting device according to the conventional technology.
Figure 2:
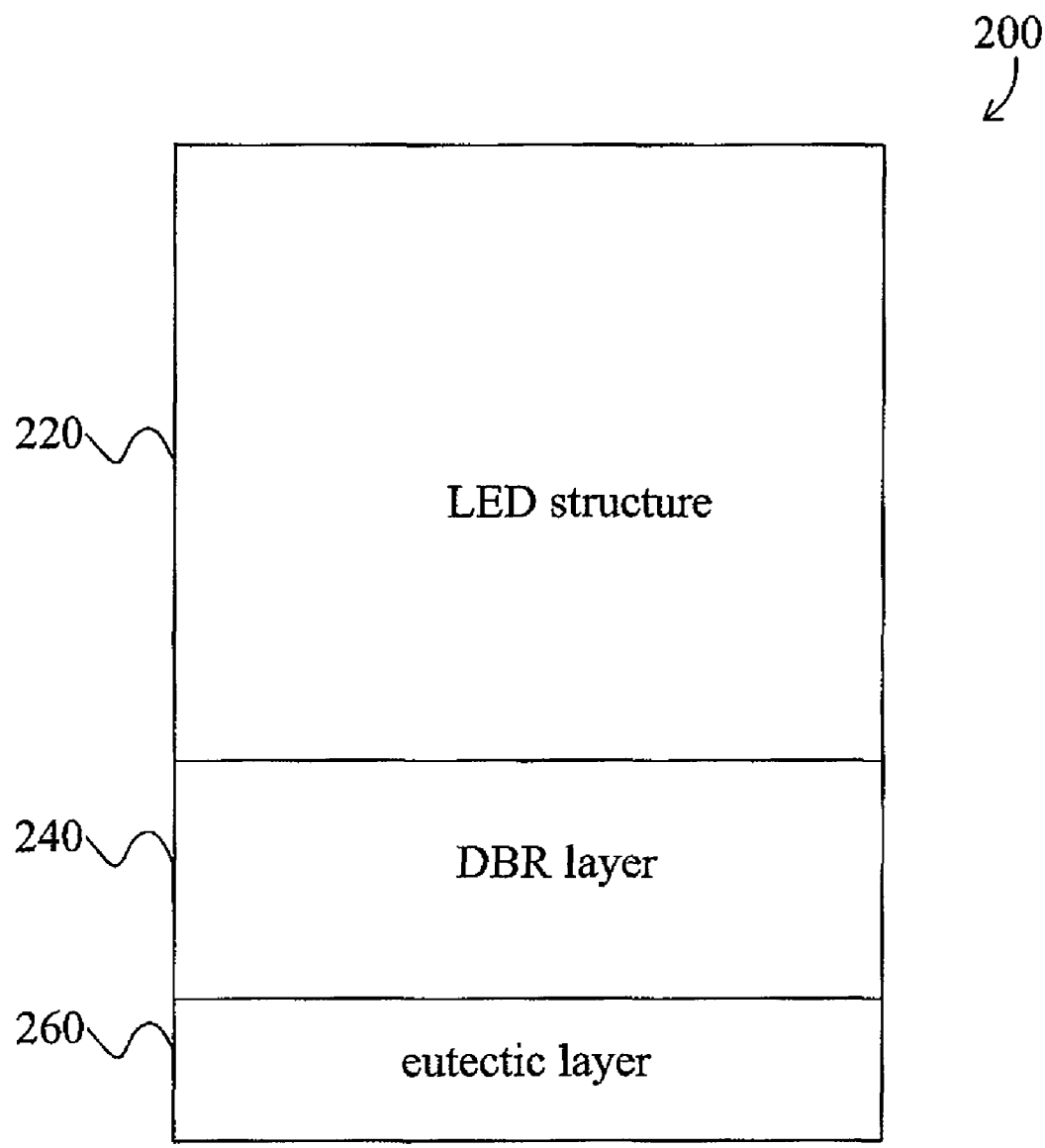
FIG. 2. shows a schematic diagram of a lighting device according to an embodiment of the present invention.

FIG. 2 shows a schematic diagram of a lighting device 200 according to an embodiment of the present invention. The high efficiency lighting device 200 comprises a light emitting diode structure 220, a distributed-Bragg reflecting (DBR hereinafter) layer 240 and a eutectic layer 260. The DBR layer 240 is between the light emitting diode structure 220 and the eutectic layer 260. In the manufacture process of fabricating the high efficiency lighting device 200, the light emitting diode structure 220 is first provided. The present invention is applicable to any conventional light emitting diodes, for example, InGaN-based high brightness light emitting diodes, but not limited to those.

Next, the DBR layer 240 is attached to the light emitting diode structure 220 through vapor deposition, so as to replace the conventional metal reflecting layer and the inherent poor reflectivity thereof. Applying the DBR layer 240 enables the reflectivity of the lighting device 200 to greatly increase to above 90%, and preferably, to almost 100%. At last, via the distributed-Bragg reflecting layer 240, the light emitting diode structure 220 is connected to the eutectic layer 260 to form the high efficiency lighting device 200.

In this embodiment, the eutectic layer 260 is a gold/tin alloy layer, which serves in place of the conventional silver paste binding process, thereby tremendously resolving the heat dissipation issue of dice. However, it is to be noted that the present invention is not limited to the use of gold/tin alloy. Furthermore, in this embodiment, the thickness of the eutectic layer 260 is around 1.5 micrometers, but to which the present invention is not limited.

Figure 3:
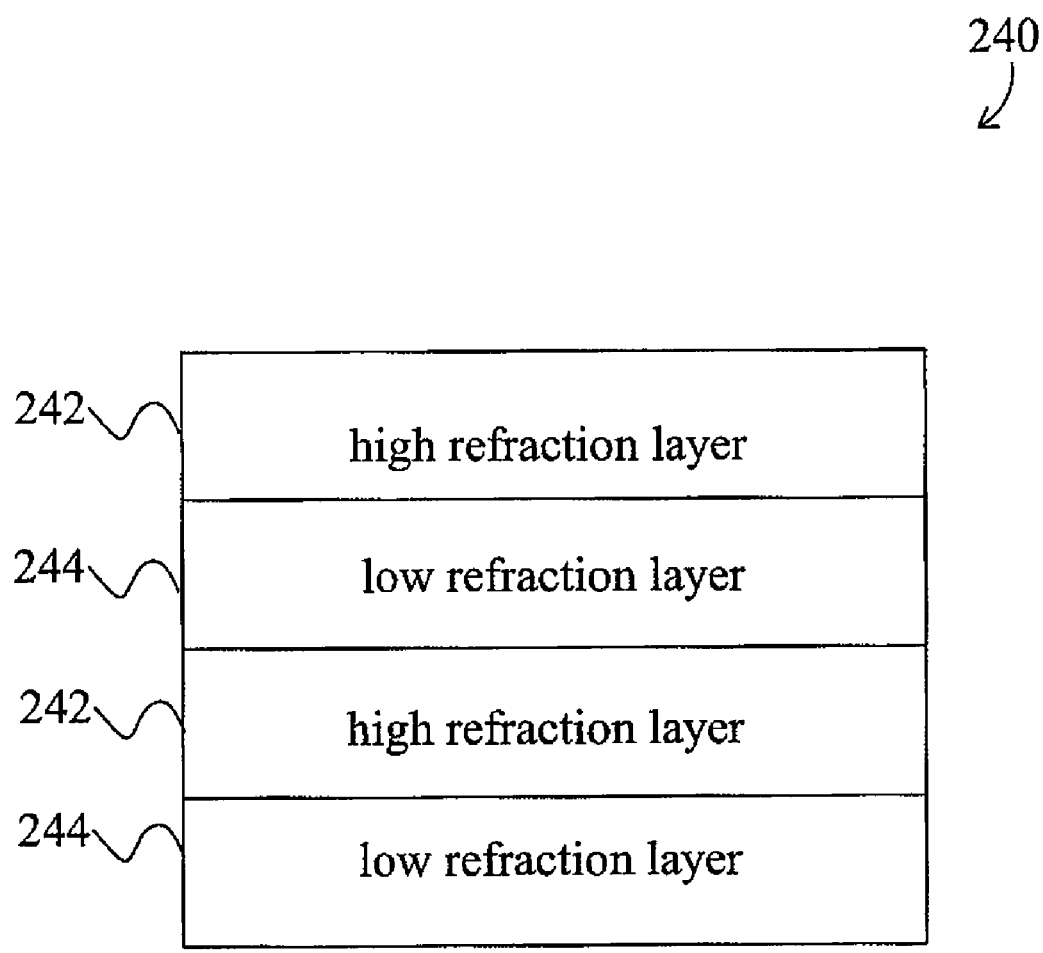
FIG. 3. shows a schematic diagram of the distributed-Bragg reflecting layer of FIG. 2.

Now referring to FIG. 3, which further shows the DBR layer 240 of FIG. 2. The DBR layer 240 has multiple high refraction layers 240 and multiple low refraction layers 244. The high refraction layers 242 referred to herein, compared to the low refraction layers 244, are formed using materials with a higher refractive index. By contrast, the low refraction layers 244 are formed using materials with a lower refractive index compared to the high refraction layers 242.

As shown in FIG. 3, the multiple high refraction layers 242 and the multiple low refraction layers 244 are formed in an alternating manner, so as to form a stacked film having an alternate high/low refraction pattern. The high-refractive-index materials and the low-refractive-index materials are used in manufacturing the stacked film to form the DBR 240 with high reflectivity, thereby increasing the lighting efficiency of the light emitting diodes undergone eutectic processing.

It is to be noted that the figures used herein are merely exemplary, and the present invention in itself may contain more different modifications and variations. For example, the DBR layer 240 is not limited to having four layers as shown in FIG. 3, but may have more and fewer stacked layers depending on in-field implementation conditions. Furthermore, in this embodiment, the multiple high refraction layers 242 are titanium dioxide layers, whereas the multiple low refraction layers 244 are silicon dioxide layers. The present invention is not limited to these materials.

Figure 4:
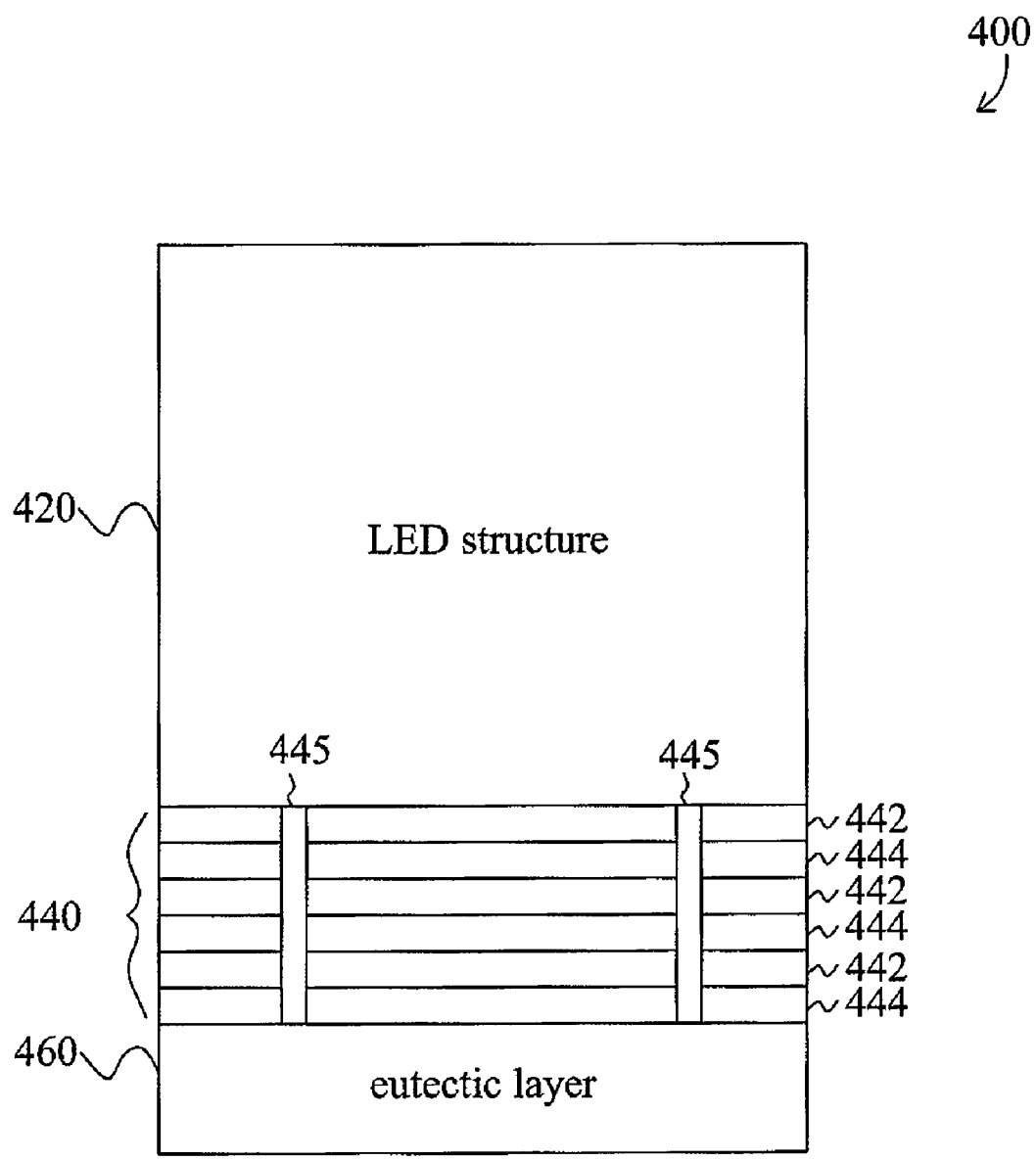
FIG. 4. shows a schematic diagram of a lighting device according to another embodiment of the present invention.

FIG. 4 shows a schematic diagram of a lighting device 400 according to another embodiment of the present invention. The high efficiency lighting device 400 includes a light emitting diode structure 420, a DBR layer 440 and an eutectic layer 460. The DBR layer 440 is between the light emitting diode structure 420 and the eutectic layer 460. In the manufacture process of fabricating the high efficiency lighting device 400, the light emitting diode structure 420 is first provided. The present invention is applicable to any conventional light emitting diodes, for example, InGaN-based high brightness light emitting diodes, but not limited to those.

In the present embodiment, the DBR layer 440 has multiple high refraction layers 442, multiple low refraction layers 444 and a micro-contact layer array 445. As shown in FIG. 4, the multiple high refraction layers 442 and the multiple low refraction layers 444 are formed in an alternating manner, so as to form a stacked film having an alternate high/low refraction pattern. The high-refractive-index materials and the low-refractive-index materials are used in manufacturing the stacked film to form the DBR 240 with high reflectivity, thereby increasing the lighting efficiency of the light emitting diodes undergone eutectic processing.

The micro-contact layer array 445 is connected to the light emitting diode structure 420 and the eutectic layer 460 to increase the heat dissipating efficiency of the components. For the sake of figurative clarity and convenience, the embodiment the micro-contact layer array 445 is composed of two micro-contact layers, though the present invention is not limited to this. In the present invention, more or fewer micro-contact layers may also be used to form the micro-contact layer array 445. Furthermore, the micro-contact layer array 445 may employ any metal material.

The DBR layer 440 is attached to the light emitting diode structure 420 through vapor deposition, so as to replace the conventional metal reflecting layer and the inherent poor reflectivity thereof. Applying the DBR layer 440 enables the reflectivity of the lighting device 400 to greatly increase to above 90%, and preferably, to almost 100%. At last, via the distributed-Bragg reflecting layer 440, the light emitting diode structure 420 is connected to the eutectic layer 460 to form the high efficiency lighting device 400. Furthermore, in this embodiment, the thickness of the eutectic layer 460 is around 1.5 micrometers, though the present invention is not limited to this.

Summing the descriptions above, and in view of the undesirable light absorbance and poor reflectivity of the metal reflecting layer, the present invention utilizes a DBR layer which increases the reflectivity to nearly 100%, thereby greatly increasing the lighting efficiency of the lighting device. Furthermore, conventional metal reflecting thin film has low reflectivity at the UV band, but the DBR layer used in the present invention does not pose such a problem. Moreover, manufacture process of conventional metal reflecting layers is not easy to control in that the reflectivity is affected by vapor deposition conditions. The DBR layer used in the present invention, on the other hand, again does not pose such a problem, therefore further enhancing the flexibility of manufacture process assurance. The selectively disposed micro-contact array in the DBR layer can further increase the heat dissipating efficiency of the components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. It is intended that the scope of the invention be defined by the claims appended hereto and their equivalents.

What is claimed is:

1. A high efficiency lighting device, comprising:
a light emitting diode structure;
an eutectic layer; and
a distributed-Bragg reflecting layer (DBR) between said light emitting diode structure and said eutectic layer, said distributed-Bragg reflecting layer being attached to said light emitting diode structure by vapor deposition, wherein said distributed-Bragg reflecting layer comprises:
a plurality of high refraction layers;
a plurality of low refraction layers, wherein said high refraction layers and said low refraction layers are arranged in an alternating manner, so as to form a stacked thin film having an alternate high/low refraction pattern; and
a micro-contact layer array in said stacked thin film and including at least one micro-contact layer, wherein said eutectic layer is made of heat dissipation materials and in direct contact with said distributed-Bragg reflecting layer, and wherein said micro-contact layer array extends vertically through the stacked thin film and connects said light emitting diode structure and said eutectic layer.

2. The device of claim 1, wherein said high refraction layers are titanium dioxide layers, and said low refraction layers are silicon dioxide layers.

3. The device of claim 1, wherein said micro-contact layers are formed by using metal materials.

4. The device of claim 1, wherein said eutectic layer is made from gold/tin alloy.

5. The device of claim 1, wherein the thickness of said eutectic layer is around 1.5 micrometers.

\* \* \* \* \*